(12) United States Patent
Inoue et al.

(10) Patent No.: US 7,744,056 B2
(45) Date of Patent: Jun. 29, 2010

(54) HARD-MATERIAL-COATED MEMBER EXCELLENT IN DURABILITY

(75) Inventors: Kenichi Inoue, Yasugi (JP); Fumiaki Honda, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 255 days.

(21) Appl. No.: 11/860,951

(22) Filed: Sep. 25, 2007

(65) Prior Publication Data
US 2008/0073482 A1 Mar. 27, 2008

(30) Foreign Application Priority Data
Sep. 27, 2006 (JP) .............................. 2006-261848
Sep. 27, 2006 (JP) .............................. 2006-261849

(51) Int. Cl.
*B32B 7/02* (2006.01)
*B28B 7/36* (2006.01)
*B22C 3/00* (2006.01)

(52) U.S. Cl. ...................... 249/135; 249/114.1; 164/72; 164/138; 428/698

(58) Field of Classification Search .............. 249/114.1, 249/115, 116, 134, 135; 425/90; 106/38.2; 428/698; 75/236, 240; 164/33, 54, 57.1, 164/72, 138; 427/402, 419.1, 419.7
See application file for complete search history.

(56) References Cited

U.S. PATENT DOCUMENTS

| | | | | |
|---|---|---|---|---|
| 3,964,937 | A * | 6/1976 | Post et al. | 148/210 |
| 5,246,787 | A * | 9/1993 | Schulz et al. | 428/629 |
| 5,503,912 | A * | 4/1996 | Setoyama et al. | 428/216 |
| 6,284,366 | B1 * | 9/2001 | Konig et al. | 428/336 |
| 7,523,914 | B2 * | 4/2009 | Chang et al. | 249/114.1 |
| 2003/0059632 | A1 * | 3/2003 | Inoue | 428/457 |
| 2004/0137279 | A1 * | 7/2004 | Richter et al. | 428/701 |
| 2005/0003238 | A1 * | 1/2005 | Leverenz et al. | 428/698 |
| 2006/0032602 | A1 * | 2/2006 | Inoue et al. | 164/312 |
| 2006/0222893 | A1 * | 10/2006 | Derflinger | 428/698 |
| 2006/0234081 | A1 * | 10/2006 | Inoue et al. | 428/627 |
| 2006/0286410 | A1 * | 12/2006 | Ahlgren et al. | 428/698 |
| 2007/0087224 | A1 * | 4/2007 | Ishikawa | 428/697 |
| 2007/0111032 | A1 * | 5/2007 | Nagano et al. | 428/698 |
| 2007/0292712 | A1 * | 12/2007 | Misaki et al. | 428/689 |
| 2008/0014420 | A1 * | 1/2008 | Chan | 428/213 |

FOREIGN PATENT DOCUMENTS

| | | |
|---|---|---|
| EP | 1626104 A1 | 2/2006 |
| JP | 58-031066 A | 2/1983 |
| JP | 61-033734 A | 2/1986 |
| JP | 7-112266 A | 5/1995 |
| JP | 10-137915 A | 5/1998 |
| JP | 11-092909 A | 4/1999 |
| JP | 2001-011599 A | 1/2001 |
| JP | 2002-371352 A | 12/2002 |
| JP | 2003-245738 A | 9/2003 |
| JP | 2005-008920 A | 1/2005 |
| JP | 2006075867 A * | 3/2006 |

OTHER PUBLICATIONS

Dobrzanski et al. "Strucutre and properties of . . . ", Journal of Material Processing Technology 164-165 (2005) 843-849.*
Panjan et al.; "PVD CrN coating for . . . "; Vacuum 61 (2001) 241-244.*
Navinsek et al., "Improvement of hot-working . . . ", Surface and coating Technology 142-144 (2001) 1148-1154.*
Shicai Yang, et al., "The properties and performance of Cr-based multilayer nitride hard coatings using unbalanced magnetron sputtering and elemental metal targets," Surface and Coatings Technology, Nov. 2004, pp. 662-668, vol. 188-189, Elsevier, Amsterdam, NL.

* cited by examiner

*Primary Examiner*—Philip C Tucker
*Assistant Examiner*—Dimple N Bodawala
(74) *Attorney, Agent, or Firm*—Sughrue Mion, PLLC

(57) ABSTRACT

There is provided a hard-material-coated member which is suitable as a long-life mold for plastic working of metals and which has a metal as base material and coating layers formed at least on its working plane by physical vapor deposition. At least three layers, i.e., a layer a) as the outermost layer, a layer c) just above the base material and a layer b) between layer a) and the layer c) are formed as coating layers. The hardness values of these layers in terms of hardness symbol HV 0.025 are as follows:
  2500>(the hardness of the layer a)>1000,
  3500>(the hardness of the layer b)>2300,
  2500>(the hardness of the layer c)>1000,
  (500+the hardness of the layer a)<(the hardness of the layer b), and (500+the hardness of the layer c)<(the hardness of the layer b); the thickness of the layer b) is smaller than that of the layer c); and the total thickness of the coating layers is 5 to 15 μm.

12 Claims, 2 Drawing Sheets

A: NO PEELING  B: SLIGHT PEELING  C: LESS THAN 1/2 OF CIRCUMFERENCE PEELING  D: 1/2 OR MORE TO LESS THAN 3/4 OF CIRCUMFERENCE PEELING  E: 3/4 OR MORE OF CIRCUMFERENCE PEELING (EXCEPT ALL-AROUND PEELING)  F: ALL-AROUND PEELING

_US 7,744,056 B2_

HARD-MATERIAL-COATED MEMBER EXCELLENT IN DURABILITY

BACKGROUND OF THE INVENTION

The present invention relates to a hard-material-coated member excellent in durability which is the most suitable as, for example, (1) a mold for plastic working which is used for forging, pressing or the like and is required to have wear resistance, and (2) a casting member used in contact with a molten metal, such as a mold used for die casting or casting, a core pin, a piston ring used in an injection machine for die casting, or the like.

Molds obtained by using a metal or steel, such as cold-die steel, hot-die steel, high-speed steel, a hard alloy or the like as a base material have been used for plastic working such as forging or pressing. Methods for the above working are classified into cold working in which working is conducted near room temperature and warm or hot working (hereinafter referred to also as warm-hot working) in which a material to be processed is heated at 400° C. or higher. A mold used in either of these working methods is required to have wear resistance on its working plane.

In recent years, a load on the surface of a mold has been increased with an increase in the strength of a material to be processed, an increase in the precision of a product and an increase of the speed of a molding cycle. Therefore, molds having a working plane coated with a hard material such as TiC or TiN by chemical vapor deposition (hereinafter referred to also as a CVD method) have increased in number. However, as characteristics required of a mold, not only wear resistance but also increased precision of the mold itself has come to be required. Therefore, a CVD method employing a coating temperature of 1,000° C. or higher has become unable to satisfy the above-mentioned requirement sufficiently because the mold is remarkably deformed during the coating and a steel-based mold material involves a problem of heat-treatment distortion caused by heat treatment such as quenching and tempering conducted after the coating.

In such circumstances, physical vapor deposition (hereinafter referred to also as a PVD method) has come to be often adopted which permits coating at a temperature lower than a tempering temperature for a mold material. For example, in the case of cold working, there have been proposed a method in which a base material for a mold in a specific composition range is subjected to a nitriding treatment and then a coating layer of TiN is formed by a PVD method (patent document 1) and a method in which the surface of a mold is coated with a nitride, carbide or carbonitride composed mainly of V, by a PVD method (patent document 2). In the case of hot working, there have been proposed a method in which a pretreatment for a PVD method is specified and coating with CrN or TiAlN is conducted after a nitriding treatment (patent documents 3 and 4) and a method in which a CrAlWN coating film containing Al and W is formed (patent document 5).

On the other hand, steels such as hot-die steel, high-speed steel, stainless steel and the like have been used in casting members used for molding by casting of a molten metal. A metal to be molded that is most frequently used for molding by casting is an aluminum alloy. In the case of the above-mentioned steel materials used in casting members such as molds, the steel material in a portion of the casting member in contact with the aluminum alloy is wasted by melting in a melt of the aluminum alloy to increase the iron content of the aluminum alloy melt and deteriorate the quality of a cast product. Moreover, the waste by melting of the molds and the like causes various operational troubles.

As a measure against the above problem, nitriding on the working plane of a casting member has been often conducted because it gives a deep hardened layer and can be conducted at a very low cost. However, since employment of a high-melting aluminum alloy as a material to be molded has become frequent for the purpose of increasing the strength of a cast product, nitriding has the following disadvantages: N in the hardened layer is easily diffused into an aluminum melt at a high temperature, so that the resistance to the waste by melting is deteriorated by the disappearance of the hardened layer, resulting in rapid progress of the waste-by-melting phenomenon.

In order to solve such a problem, employment of a mold having a working plane coated with a ceramic hardly reactive with a molten metal by physical vapor deposition (hereinafter referred to also as a PVD method) has become frequent. There have been proposed, for example, a method in which a base material for a mold is subjected to carburizing or nitriding and then a coating layer of TiC, TiN or the like is formed by a PVD method (patent document 6), and a method in which the surface of a mold is coated with a Ti intermediate layer and then TiAlN (patent document 7). There have also been proposed methods in which CrN is used as a coating layer (patent documents 8 and 9).

Patent document 1: JP-A-58-031066
Patent document 2: JP-A-2002-371352
Patent document 3: JP-A-11-092909
Patent document 4: JP-A-2003-245738
Patent document 5: JP-A-2005-008920
Patent document 6: JP-A-61-033734
Patent document 7: JP-A-07-112266
Patent document 8: JP-A-10-137915
Patent document 9: JP-A-2001-011599

As to a mold for plastic working, a coating layer of TiC or TiN formed by a CVD method has a high hardness and a relatively large thickness of about 10 μm and hence has satisfactory characteristics, but the precision of a mold having such a coating layer is not satisfactory because of, for example, the deformation of the mold caused by a high coating temperature. On the other hand, the coating layer formed by a PVD method, which has been proposed in any of patent documents 1 to 5, gives a satisfactory precision to a mold but is inferior in adhesion to a layer formed by a CVD method. Therefore, when an attempt is made to impart a sufficient durability to the mold by increasing the layer thickness, the coating layer becomes easily peelable. Accordingly, the function of the coating layer cannot sufficiently satisfy the requirements in the use environment of molds for forging or pressing which has become severe year by year.

As to a casting member, an aluminum alloy melt is cast at a relatively high temperature because of a recent increased speed of casting cycles. Therefore, the use environment of a member used in contact with the melt, such as a casting mold, has become more severe. That is, the following troubles have come to be remarkably caused: the thermal expansion of a mold or other members by a molten metal during casting; and the deflection of the mold or the members by shrinkage thereof by application of a mold release agent after the solidification of a material to be processed or by the solidification and shrinkage of the material to be processed. As a result, the coating layers having the compositions proposed in patent documents 6 to 9 are peeled off during use of a member having the coating layer, and a molten metal infiltrates into the member through the peeled portion and reacts with iron in a base material just under the surface treatment layer of the member to form an alloy. When a portion just under the surface coating layer is expanded by the formation of the alloy, the following phenomenon is observed: the treatment layer is peeled off in a moment, so that the waste of the member by melting proceeds rapidly.

In recent years, die cast products of aluminum alloys or magnesium alloys have come to be used as the boxes of hard discs, personal computers, mobile phones and the like, which are required to be reduced in weight. Therefore, such cast products have been reduced in thickness. In order to reduce the thickness of the cast products, the speed of injection of a melt into a mold has to be increased. The above proposed coating layers have insufficient resistance to wear by a melt. An explanation is given below by taking the case of a casting mold. Since the coating layer is worn away by a fluid in a region near the gate of the mold where a melt is introduced into the mold at a high speed, the mold repairing cycle and the mold life are decreased, and the shape of a cast product is unsatisfactory.

The present invention is intended to provide a hard-material-coated member that is excellent in durability because of the excellent adhesion of its coating film in various use environments. Specifically, the present invention is intended to provide a hard-material-coated member which is the most suitable as a mold for plastic working which is used for plastic working of a metal, such as cold or warm-hot forging or pressing and is free from the above problems involved in a mold required to have wear resistance. Furthermore, the present invention is intended to provide a hard-material-coated member which is the most suitable as a casting member free from the above problems which is used with its working plane being in contact with a molten metal at a high temperature, such as a die casting mold or a core pin.

SUMMARY OF THE INVENTION

The present inventors closely investigated the influences of the compositions of coating layers, a layer structure and film formation conditions on the durability of a hard-material-coated member used for the above-mentioned purpose. The influences are as follows. In the case of a mold for plastic working coated with a hard material by a PVD method, the mechanism of the progress of its wear was noted and the influences on the adhesion and wear resistance of coating layers formed on the working plane of the aforesaid mold were investigated. In the case of a casting member, the mechanism of the occurrence of its troubles was noted and the influences on the resistance to waste by melting and wear resistance of coating layers formed on the working plane (the plane in contact with a melt) of the aforesaid member were investigated.

As a result, it was found that by forming coating layers capable of functioning in a region from the surface of a base material to a working plane in contact with a material to be processed, as a composite layer in which the coating layers are classified according to their hardness distribution, and by adjusting the relationship among the thickness values of these layers, a very good wear resistance can be imparted to a mold for plastic working such as forging or pressing and moreover, very good resistance to waste by melting and wear resistance can be imparted to a casting member. By these results, it was confirmed that even when the thickness of the coating layers are increased in order to impart a sufficient durability to the mold for plastic working irrespective of whether the mold is for cold working or warm-hot working, the coating layers function without peeling, so that the life of the mold for plastic working is markedly improved. Moreover, by the above results, it was confirmed that in a core pin for die casting of an aluminum alloy, there are sufficiently suppressed the waste by melting of the pin caused by peeling of the coating layers by the deflection of the pin during the solidification and shrinkage of a cast product, and the wear of the pin caused by the collision of a melt at a high speed with the pin, so that the life of the core pin as casting member is markedly improved.

That is, a first aspect of the present invention is directed to a hard-material-coated member with an excellent durability comprising a metal as a base material and having coating layers formed at least on its working plane by physical vapor deposition, which is characterized by the following: at least three layers, i.e., a layer a as the outermost layer, a layer c just above the base material and a layer b between the layer a and the layer c are formed as the coating layers; the hardness values of these layers in terms of hardness symbol HV 0.025 are as follows:

2500>(the hardness of the layer a)>1000,

3500>(the hardness of the layer b)>2300,

2500>(the hardness of the layer c)>1000, (500+the hardness of the layer a)<(the hardness of the layer b), and (500+the hardness of the layer c)<(the hardness of the layer b); the thickness of the layer b is smaller than that of the layer c; and the total thickness of the coating layers is 5 to 15 μm. The member is preferably a mold for plastic working or a casting member.

Each of the layer a as the above-mentioned outermost layer and the layer c just above the base material preferably consists of any of a nitride, a carbide and a carbonitride, the metal element portion of which is composed mainly of Ti or Cr, and the layer b as a coating layer between the outermost layer a and the layer c just above the base material preferably consists of any of a nitride, a carbide and a carbonitride, the metal element portion of which is composed mainly of one or more elements selected from Ti, Cr and Al.

The thickness of the layer a as the outermost layer is preferably 1 to 5 μm, the thickness of the layer b is preferably 1 to 5 μm, and the thickness of the layer c just above the base material is preferably 2 to 7 μm.

In addition, the base material having the coating layers formed thereon preferably has a hardness at a depth of 25 μm from the outermost surface of the base material which is higher than that at a depth of 500 μm from the outermost surface of the base material by 100 or more in terms of hardness symbol HV 0.2.

Conventional molds coated with TiN, VCN, CrN, TiAlN or CrAlWN by physical vapor deposition do not have a sufficient life to cope with the environment of use that has become severe in recent years. By using as a mold a member having the surface coating layer structure according to the present invention, the wear resistance of the working plane of the mold can be improved, so that the life of the mold for plastic working can be greatly improved.

Conventional casting members coated with TiN, TiCN or CrN have become unable to have a sufficient life to cope with use environment that has become severe in recent years. By using as a casting member a member having the surface coating layer structure according to the present invention, the resistance to waste by melting and wear resistance of a mold and other members can be improved, so that the life of the mold and the other members can be greatly improved.

DETAILED DESCRIPTION OF THE INVENTION

Figure 1:
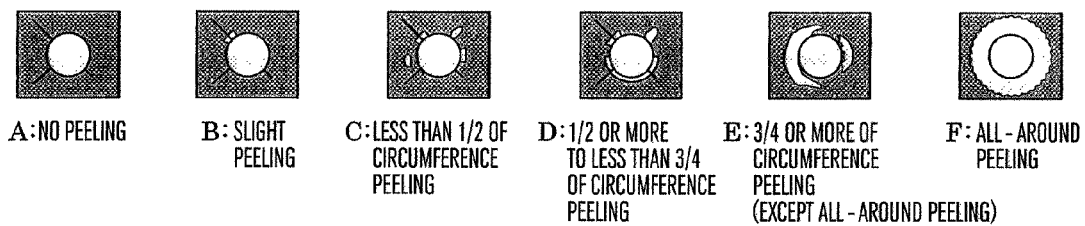
FIG. 1 is a diagram showing a criterion for estimating the degree of peeling in an adhesion evaluation test using a Rockwell hardness tester.

It is not sufficient that a hard material to be formed into coating layers on the working plane of a mold is investigated by noting only characteristics of the outermost layer, such as its hardness and resistance to oxidation. That is, total characteristics of the coating layers have to be investigated by, of course, considering their adhesion to the base material. Therefore, in the present invention, the coating layers are used in the form of a composite coating layer that can be given characteristics required of the coating layers, as much as possible. In the case of the coating layers in the present invention, the relationship among the hardness values of the layers is very important in imparting a sufficient wear resistance to a mold for forging or pressing.

The above applies also to a hard coating film to be formed on the working plane of a casting member. It is not sufficient that the coating film is investigated by noting its characteristics only for a melt to be brought into contact with the coating film. That is, total characteristics of the coating film have to be investigated by, of course, considering its affinity for the base material. Therefore, as the coating film in the present invention, a composite coating layer is used which can be given as much as possible both characteristics required of the outermost surface to be brought into contact with the melt and required characteristics for the base material. The main role of the outermost layer used in the present invention is to impart resistance to waste by melting and wear resistance to a casting member. Thus, the presence of the outermost layer is very important. Accordingly, the coating film in the present invention has to have the above characteristics to a high degree with good balance.

On the basis of the result of investigation by the present inventors, at least three layers such as a layer a as the outermost layer, a layer c just above a base material and a layer b between the layer a and the layer c are formed as coating layers on the working plane of a member by physical vapor deposition. As to the boundaries among the three layers, these layers are classified according to their hardness characteristics. It was confirmed that particularly in improving the adhesion of the coating layers, it is very important to employ a structure in which the hardness values of the three layers in terms of hardness symbol HV 0.025 are as follows:

2500>(the hardness of the layer a)>1000,
3500>(the hardness of the layer b)>2300,
2500>(the hardness of the layer c)>1000,
(500+the hardness of the layer a)<(the hardness of the layer b), and
(500+the hardness of the layer c)<(the hardness of the layer b). The term "hardness symbol HV 0.025" means a hardness value at a test load of 0.2452N in the Vickers hardness test method prescribed in JIS-Z-2244.

The attacking properties of relatively soft materials among hard materials against a material to be processed (a cast product) are lowered with a decrease of their hardness, and the relatively soft materials are unlikely to receive an impact during use and are unlikely to undergo cracking in the coating layer of a casting member by a heat cycle or the deflection of the member. Moreover, in the case of physical vapor deposition, the adhesion of the relatively soft material as a coating material is satisfactory. Therefore, although the outermost layer has to have a certain degree of hardness, the employment of a layer a of the relatively soft material as the outermost layer permits lowering of the attacking properties against the material to be processed, namely, suppression of initial sudden scoring caused by scratching on the material to be processed, by the coating layer. In addition, since there is obtained a structure in which the coating layers are covered with the relatively soft material not susceptible to cracking, scoring or peeling starting from cracks can be suppressed in a mold for plastic working, and peeling and waste by melting can be suppressed in a casting member. As a result, the adhesion of the whole of the coating layers is improved. In this case, the reason why the relatively soft material is used also in the layer c just above the base material although the layer c similarly has to have a certain degree of hardness is that the essential adhesion between the base material and the coating layers is desired to be improved.

On the other hand, the layer b is formed of a relatively hard material having a hardness of more than 2300 HV 0.025, and is formed in order to improve the wear resistance. In contrast to the above-mentioned relatively soft materials, the adhesion of materials having a high hardness is deteriorated with an increase of their hardness. It was found that in this case, the layer b is not easily peeled off when it is held between the layer a and the layer c which are relatively soft. Furthermore, the following was confirmed: although the layer a as the outermost layer is preferentially worn away in a region where the wear of a mold for plastic working or the wear of a casting member by a melt is remarkable, the hard layer b appears from below the layer a, so that the coating layers perform their function of improving the wear resistance in the region requiring the improvement.

As to the thickness of the individual layers, when the hard layer b is thicker than the layer c, the balance among characteristics of the layers is disturbed, resulting in the deterioration of adhesion of the layer b. Therefore, the relationship between the thickness values of the layer b and the layer c is the layer b<the layer c. When the total thickness of the coating layers is less than 5 μm, a sufficient wear resistance of a mold for plastic working or a sufficient resistance to waste by melting of a casting member cannot be attained. When the total thickness of the coating layers is more than 15 μm, their adhesion is extremely deteriorated. Therefore, the total thickness of the coating layers is adjusted to 5 to 15 μm, preferably 7 to 12 μm.

Physical vapor deposition is specified as a coating method for the member of the present invention. It is adopted in order to lessen thermal influence on the base material to be coated with a hard material and suppress thermal distortion, deformation or the like caused in the member. This is because when the physical vapor deposition is adopted, a film can be formed at a temperature not higher than a tempering temperature for, for example, hot-die steel or high-speed steel as base material, or a tempering temperature for cold-die steel or the like in the case of a mold for plastic working, so that compressive stress can be left in the coating film. Although the kind of the physical vapor deposition is not particularly limited, it is preferable to adopt a physical vapor deposition method in which a bias voltage is applied to the base material to be coated, such as an arc ion plating method or a sputtering method.

A metal material as the base material is not particularly specified and there can be used, for example, cold-die steel, hot-die steel, high-speed steel and hard alloys, as described above. As these metals, there can also be used modified metal species conventionally proposed as steel species usable in a mold or a member used in contact with a melt, inclusive of the metal species (steel species) specified in JIS and the like On the working plane of the hard-material-coated member of the present invention, it is sufficient that the layer a as the outermost layer among the coating layers formed on the working plane and the layer c just above the base material satisfy the relationship between their hardness and thickness and those of the layer b. Each of the layer a and the layer c, however, preferably consists of any of a nitride, a carbide and a carbonitride, the metal element portion of which is composed mainly of Ti or Cr, depending on the purpose of use of the member. As to the main constituent Ti or Cr, the proportion of Ti or Cr is preferably 70 (atomic %) or more, more preferably 90 (atomic %) or more (inclusive of substantially 100 (atomic %)), based on the total number of metal (inclusive of semi-metal) atoms excluding nitrogen and carbon atoms.

In addition, on the working plane of the hard-material-coated member of the present invention, the layer b formed between the layer a and the layer c preferably consists of any of a nitride, a carbide and a carbonitride, the metal element portion of which is composed mainly of one or more elements selected from Ti, Cr and Al. As to the one or more main constituents, their proportion is the same as in the case of the above-mentioned layers a and c, namely, it is preferably 70 (atomic %) or more, more preferably 90 (atomic %) or more (inclusive of substantially 100 (atomic %)). In this case, in order to satisfy the relationship between the hardness of the layer b and that of the layers a and c, the following is necessary: for example, when each of the layer a and the layer c is TiN, a TiAlN type hard material harder than TiN is chosen as the layer b and formed into a coating layer by employing a ratio between the components Ti and Al or film formation conditions, which satisfy the relationships among the hardness values of the individual layers, or a carbide or a carbonitride (e.g. TiC or TiCN), which is harder than TiN, is similarly formed into a coating layer under film formation conditions that satisfy the relationships among the hardness values of the individual layers.

Each of the layer a, layer b and layer c according to the present invention preferably comprises a compound composed mainly of a metal common to the three layers, from the viewpoint of the adhesion among the these layers. For example, in the case of a Cr-containing nitride, the following structure is preferable: the layer a comprises CrN, the layer b comprises CrAlN and the layer c comprises CrN.

The above structure is described as an example. Although the metal element portion of each of the layer a and the layer c is composed mainly of Ti or Cr, it may contain other metal (semi-metal) elements such as elements of groups IVa, Va and VIa, Al, Si, B and the like in a slight amount of 10 atomic % or less if necessary. Although the metal element portion of the layer b is composed mainly of one or more elements selected from Ti, Cr and Al, it may contain other metal (semi-metal) elements such as elements of groups IVa, Va and VIa, Si, B and the like in a slight amount of 10 atomic % or less if necessary.

The thickness of each layer constituting the composite coating layer in the present invention is described below. The thickness of the layer a as the outermost layer in the present invention is preferably 1 to 5 μm. When the thickness is less than 1 μm, the layer a is not sufficient in wear resistance and resistance to waste by melting and hence disappears early, so that the inhibitory effect on initial sudden scoring, i.e., one of the roles of the layer a cannot be obtained in some cases. On the other hand, when the thickness is more than 5 μm, the layer a is early peeled off in some cases, depending on use conditions. Therefore, the thickness of the layer a as the outermost layer among the coating layers formed on the working plane in the present invention is preferably 1 to 5 μm.

The thickness of the layer b as a coating layer between the layer a as the outermost layer and the layer c just above the base material is preferably 1 to 5 μm. When the thickness is less than 1 μm, the layer b is not sufficient in some cases in wear resistance that is the purpose of coating with the layer b. On the other hand, when the thickness is more than 5 μm, the layer b is poor in adhesion and hence is early peeled off in some cases. Therefore, the thickness of the layer b in the present invention is preferably 1 to 5 μm.

The thickness of the layer c, the layer just above the base material in the present invention is preferably 2 to 7 μm. When the thickness is less than 2 μm, the layer c is too thin and hence hardly has a sufficient adhesion to the base material, depending on use conditions. On the other hand, when the thickness is more than 7 μm, the improving effect on the adhesion is not changed and moreover, the layer c is early peeled off in some cases, depending on use conditions. Therefore, the thickness of the layer c, the layer just above the base material in the present invention is preferably 2 to 7 μm.

Furthermore, in the case of the member of the present invention, the base material having the coating layers formed thereon is such that its hardness at a depth of 25 μm from the outermost surface of the base material is preferably higher than that at a depth of 500 μm from the outermost surface of the base material by 100 HV 0.2 or more in terms of Vickers hardness defined in JIS-Z-2244, for the purpose of further improving the resistance to waste by melting and the wear resistance. The hardness symbol HV 0.2 indicates a hardness value at a test load 1.961N in Vickers hardness test method. It is preferable to carry out previously a surface hardening treatment utilizing diffusion, such as nitriding or carburizing, as a specific example of treatment for achieving the above purpose. In this case, a compound layer such as a nitride layer called a white layer, which is formed by nitriding, or a carbide layer observed in the case of carburizing becomes a cause for the deterioration of the adhesion of the layer c just above the base material, and hence is preferably inhibited from forming by controlling the treatment conditions or removed by polishing or the like.

DESCRIPTION OF THE PREFERRED EMBODIMENT

The present invention is illustrated in detail with reference to the following examples, which should not be construed as limiting the scope of the invention. Changes may be properly made without departing from the gist of the invention and all of them are included in the technical scope of the invention.

Example 1

High-speed steel SKH 51 specified in JIS was prepared, maintained at 1,180° C. by heating in a vacuum, quenched by nitrogen gas cooling, and then tempered at 540 to 580° C. to be subjected to thermal refining to 64 HRC. Thereafter, the thus treated material was processed into plate-shaped test pieces with a thickness of 5 mm and a length of each side of 30 mm. Each of the test pieces was coated as a base material by PVD method.

As to a method for the coating, an arc ion plating apparatus was used. First, a bias voltage of −400 V was applied to each base material in an Ar atmosphere (pressure: 0.5 Pa) and plasma cleaning with a hot filament was conducted for 60 minutes. Then, using various metal targets as sources for vapors of metal components and a reaction gas composed of $N_2$ gas as base and optionally $CH_4$ gas, a film was formed at a temperature of the base material of 500° C., a reaction gas pressure of 3.0 Pa and a bias voltage of −50 V.

In the case of samples obtained by forming a nitride layer on some of the base materials before the above-mentioned PVD coating treatment, the base materials before the PVD coating treatment were subjected to ion nitriding treatment under the following conditions. That is, before the PVD coating, the ion nitriding treatment was carried out by maintaining the base materials at 500° C. for 5 hours in an atmosphere of $N_2$ in a flow percentage of 5% (balance: $H_2$). Then, the test surface of each base material was finished by polishing. The surfaces of the base materials after the finishing were coated by PVD method under the conditions described above.

For the test pieces thus obtained, the measurement of the thickness of each layer on the coated surface, a hardness test and an adhesion evaluation test utilizing Rockwell hardness test were carried out. Methods for the measurement and the tests are described below.

(1) Measurement of Layer Thickness

The test piece was cut in the direction of the thickness so that a section of its composite coating layer might appear. The resulting piece was embedded in a resin and polished for structure observation and the thickness of each layer was measured under an optical microscope (1,000 magnifications).

(2) Hardness Test

Using the same test piece as used for the measurement of the layer thickness, the hardness of the section of each layer was measured with Microvickers tester (HM-115, mfd. by Mitutoyo Corporation). It had been confirmed that in the case of all of the test pieces obtained by subjecting the base materials before the PVD coating to the nitriding treatment, the hardness at a depth of 25 μm from the surface after the nitriding treatment and the finishing by polishing was higher than that at a depth of 500 μm from the surface by 100 HV 0.2 or more.

(3) Adhesion Evaluation Test

A dent was formed on the coated surface (30 mm×30 mm) on C scale with a Rockwell hardness tester (AR-10, mfd. by Mitutoyo Corporation), after which the vicinity of the dent was observed under an optical microscope and peeling caused around the dent was estimated according to the criterion shown in FIG. 1.

Table 1 shows the details of the coating layers of present inventive test pieces and comparative test pieces (the inferior coefficients in the metal (semi-metal) portion are atomic ratio values) and the results of the evaluations. Since the conventional test pieces did not have the coating layer structure used in the present invention, the definition of their outermost layer, layer just above the base material and intermediate layer is difficult. Therefore, the conventional test pieces are shown in Table 2.

TABLE 1

| | No. | Layer a (outermost layer) | | Layer b | | Layer c (layer just above base material) | | Total thickness μm | Nitriding | Adhesion |
|---|---|---|---|---|---|---|---|---|---|---|
| | | Thickness μm | Hardness HV0.025 | Thickness μm | Hardness HV0.025 | Thickness μm | Hardness HV0.025 | | | |
| Present inventive test piece | 1 | TiN 1.5 | 2120 | $(Ti_{0.50}Al_{0.50})N$ 2.5 | 2640 | TiN 3.4 | 2050 | 7.4 | — | A |
| | 2 | CrCN 1.4 | 2270 | $(Cr_{0.50}Al_{0.50})N$ 3.0 | 2970 | CrN 4.5 | 1460 | 8.9 | — | A |
| | 3 | CrN 3.2 | 1460 | $(Cr_{0.60}Al_{0.30}Si_{0.05})N$ 2.1 | 3110 | CrN 3.5 | 1450 | 8.8 | — | A |
| | 4 | CrN 3.3 | 1430 | $(Cr_{0.50}Al_{0.50})CN$ 4.6 | 3170 | CrN 6.5 | 1420 | 14.4 | Conducted | B |
| | 5 | TiCN 3.2 | 1870 | $(Ti_{0.50}Al_{0.50})N$ 2.1 | 2640 | TiN 3.0 | 2030 | 8.3 | Conducted | A |
| | 6 | CrN 2.0 | 1430 | $(Cr_{0.50}Al_{0.50})N$ 3.1 | 2970 | CrN 4.2 | 1350 | 9.3 | — | A |
| | 7 | $(Cr_{0.95}B_{0.05})N$ 1.7 | 2260 | $(Cr_{0.60}Al_{0.35}Si_{0.05})N$ 2.3 | 3010 | $(Cr_{0.95}B_{0.05})N$ 3.3 | 2240 | 7.3 | — | A |
| | 8 | TiN 3.5 | 2110 | TiCN 3.8 | 3240 | TiN 4.5 | 2080 | 11.8 | Conducted | A |
| | 9 | CrN 2.0 | 1430 | $(Cr_{0.50}Al_{0.50})N$ 3.1 | 2970 | CrN 4.7 | 1430 | 9.8 | — | A |
| Comparative test piece | 11 | TiN 2.5 | 2100 | TiCN 6.8 | 3220 | TiN 9.0 | 2090 | 18.3 | — | F |
| | 12 | $(Ti_{0.50}Al_{0.50})N$ 2.1 | 2680 | TiN 3.5 | 2110 | TiCN 4.6 | 3150 | 10.2 | Conducted | F |
| | 13 | CrN 2.7 | 1450 | $(Cr_{0.50}Al_{0.50})N$ 6.5 | 2960 | CrN 1.1 | 1420 | 10.3 | — | C |
| | 14 | TiCN 7.8 | 1900 | $(Ti_{0.50}Al_{0.50})N$ 3.5 | 2660 | TiN 1.1 | 2050 | 12.4 | — | C |
| | 15 | $(Cr_{0.50}Al_{0.50})N$ 2.1 | 2960 | CrN 3.1 | 1420 | $(Cr_{0.50}Al_{0.50})$ 4.4 | 2940 | 9.6 | Conducted | E |

TABLE 2

| | No. | Coating layer | | Nitriding | Adhesion |
|---|---|---|---|---|---|
| | | Thickness μm | Hardness HV 0.025 | | |
| Conventional test piece | 21 | TiN 10.5 | 2200 | — | C |
| | 22 | CrN 11.8 | 1430 | Conducted | A |
| | 23 | TiCN 10.3 | 3210 | — | F |

Figure 2:
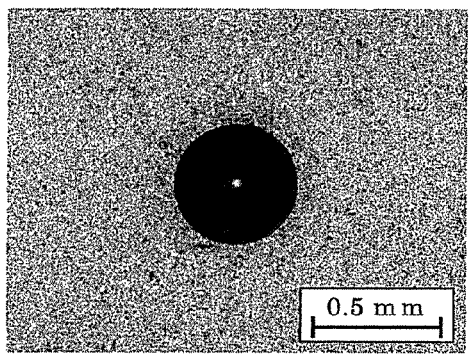
FIG. 2 is a photomicrograph showing the result of an adhesion evaluation test on present inventive test piece No. 3 (the state of the vicinity of a Rockwell dent).
Figure 3:
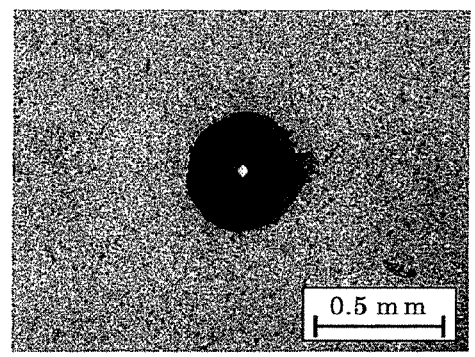
FIG. 3 is a photomicrograph showing the result of an adhesion evaluation test on present inventive test piece No. 4 (the state of the vicinity of a Rockwell dent).

It can be seen that as shown in Table 1, all of the present inventive test pieces are very excellent in the adhesion of the layers in spite of the large thickness of the layers because their coating layer structure was within the range specified in the present invention. FIGS. 2 and 3 are photomicrographs showing the results of the adhesion evaluation test on present inventive test pieces No. 3 and No. 4, respectively (the state of the vicinity of a Rockwell dent). A sufficiently excellent adhesion was attained even in present inventive test piece No. 4 whose coating layers were thicker than those of the other present inventive test pieces.

Figure 4:
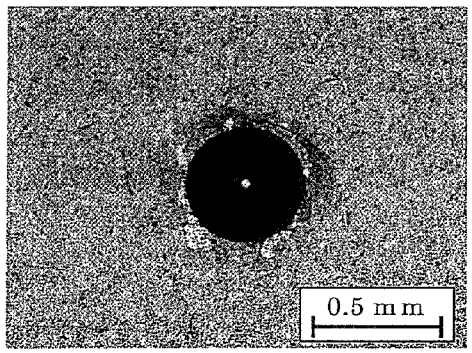
FIG. 4 is a photomicrograph showing the result of an adhesion evaluation test on comparative test piece No. 13 (the state of the vicinity of a Rockwell dent).

On the other hand, as to the evaluation results for the comparative test pieces and the conventional test pieces, comparative test piece No. 11 satisfies the requirements imposed by the present invention with respect to the hardness of each layer but is very poor in the adhesion of the layers because its layer b and layer c are too thick. Comparative test pieces Nos. 12 and 15 do not satisfy the requirements imposed by the present invention with respect to the relationship among the hardness values of the layers and are poor in the adhesion of the layers because the hardness balance among the layers was disturbed by the formation of relatively hard coating layers as the layer just above the base material and the outermost layer. Comparative test pieces Nos. 13 and 14 are superior to the other comparative test pieces in the adhesion of the layers but they are inferior to the present inventive test pieces in the adhesion of the layers because the layer c is thinner than the layer b in comparative test pieces Nos. 13 and 14. FIG. 4 shows a photomicrograph showing the result of the adhesion evaluation test on comparative test piece No. 13 (the state of the vicinity of a Rockwell dent).

Figure 5:
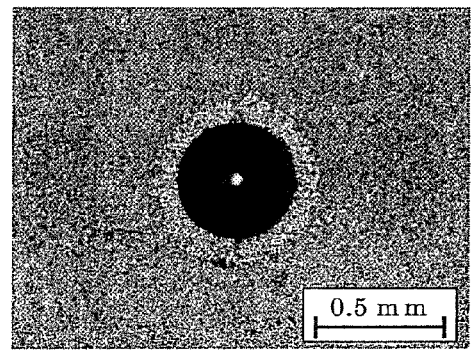
FIG. 5 is a photomicrograph showing the result of an adhesion evaluation test on conventional test piece No. 23 (the state of the vicinity of a Rockwell dent).

Conventional test pieces Nos. 21 and 23, which have a basic coating structure different from that used in the present invention, are very poor in the adhesion of the layer in a region where the thickness of the layer is relatively large as in the present invention FIG. 5 is a photomicrograph showing the result of the adhesion evaluation test on conventional test piece No. 23 (the state of the vicinity of a Rockwell dent). In conventional test piece No. 22 having a coating layer of relatively soft CrN, the coating layer is excellent in adhesion in spite of its large thickness but it is likely to be early worn away because of its very low hardness when the test piece is used as a mold.

Example 2

Next, cold-forging molds for molding a cup having a surface coating layer structure equal to those of present inventive test piece No. 3 and No. 8 in Table 1 and conventional test piece No. 23 in Table 2, respectively, were produced from SKH 51 (hardness: 64 HRC). The molds were evaluated as actual molds with respect to their life.

First, SKH 51 was roughly processed in an annealed state into a shape similar to that of a forging mold, after which it was maintained at 1,180° C. by heating in a vacuum, quenched by nitrogen gas cooling, and then tempered at 540 to 580° C. to be subjected to thermal refining to 64 HRC. Thereafter, finish processing was conducted and layers were formed by PVD method under the same conditions as in Example 1 for obtaining each of the molds described above, after conducting ion nitriding treatment in the case of test pieces to be subjected to this treatment before the coating treatment.

The molds produced above had a diameter of 30 mm and a height of 250 mm and had a processed portion as mold for molding a cup, at the top. As a material to be processed, S50C was subjected to cold forging with each mold. Table 3 shows the life of each mold.

TABLE 3

| | No. | Tool life (number of cups) | Cause for expiration of life |
|---|---|---|---|
| Present inventive mold | No. 3 | 72,000 | Wear |
| | No. 8 | 65,000 | |
| Conventional mold | No. 23 | 21,000 | Breaking |

The cold-forging molds obtained according to the present invention had an improved life of three times or more the life of the conventional mold. The life of the molds produced according to the present invention expired finally owing to wear. On the other hand, the life of the conventional mold expired owing to breaking after early peeling of the coating layer at the top followed by seizure. It was confirmed that as described above, when the present invention is applied to a cold-forging mold, the life of the mold is greatly improved.

Example 3

Warm-forging punches for molding a cup having a surface coating layer structure equal to those of present inventive test piece No. 4 and No. 5 in Table 1 and conventional test piece No. 22 in Table 2, respectively, were produced and then evaluated as actual molds with respect to their life.

First, a toughness-improved material composed of high-speed steel as base and having the chemical composition shown in Table 4 was roughly processed as a base material into a shape similar to that of a mold, after which it was subjected to oil quenching from 1,080° C. and then thermal refining to 56 HRC by tempering at 600° C. Thereafter, finish processing was conducted and nitriding treatment and the formation of layers by PVD method were carried out under the same conditions as in Example 1 for obtaining each of the punches described above.

TABLE 4

| | Chemical composition (mass %) | | | | | | | | |
|---|---|---|---|---|---|---|---|---|---|
| | C | Si | Mn | Cr | W | Mo | V | Co | Fe |
| Base material for mold | 0.50 | 0.15 | 0.45 | 4.20 | 1.50 | 2.00 | 1.20 | 0.75 | Balance |

The molds produced above had a diameter of 110 mm and a height of 300 mm and had a processed portion as punch for molding a cup, at the top. Using a forging press, a S45C work heated at 850° C. was warm forged with each punch. Table 5 shows the life of each punch.

TABLE 5

| | No. | Tool life (number of cups) | Cause for expiration of life |
|---|---|---|---|
| Present inventive punch | No. 4 | 23,000 | Stationary wear |
| | No. 5 | 24,000 | |
| Conventional punch | No. 22 | 11,000 | Wear in the form of hollow |

The punches obtained according to the present invention had an improved life of two times or more the life of the conventional punch. The life of both punches obtained according to the present invention expired owing to damage due to wear. On the other hand, the life of the conventional punch expired owing to the progress of damage in the form of a local hollow after early scoring of the curved surface portion at the top of the punch. It was confirmed that as described above, when the present invention is applied to a punch for warm forging, the life of the punch is greatly improved.

Example 4

Hot-die steel SKD 61 specified in JIS was prepared, and subjected to oil quenching from 1030° C. and then thermal refining to 47 HRC by tempering at 550 to 630° C. Thereafter, the thus treated material was processed into the following test pieces: columnar test pieces with a diameter of 10 mm and a length of 100 mm for evaluating the resistance to waste by melting, and plate-shaped test pieces with a thickness of 3 mm and a length of each side of 30 mm for evaluating the adhesion. As base materials, the test pieces described above were subjected to coating treatment. Before the coating treatment, all the test pieces were subjected to ion nitriding treatment as surface hardening treatment under the following conditions.

The surface hardening treatment before the coating treatment was the same as in Example 1 except for changing the maintenance time for the ion nitriding treatment to 10 hours. The same coating method as in Example 1 was adopted. For the test pieces thus obtained, there were carried out the measurement of the thickness of each layer on the coated surface, a hardness test, an adhesion evaluation test utilizing Rockwell hardness test and the evaluation of resistance to waste by melting. Methods for the measurement, tests and evaluation are described below.

(1) Measurement of Layer Thickness
The same as in Example 1.

(2) Hardness Test
The same as in Example 1. By the fact that the hardness at a depth of 25 μm from the surface after the nitriding treatment and the finishing by polishing was 680 HV 0.2 in all the test pieces obtained by subjecting the base materials before the PVD coating to the nitriding treatment, it was confirmed that the hardness at a depth of 25 μm was higher than the hardness at a depth of 500 μm of 47 HRC (=471 HV 0.2) by 100 HV 0.2 or more.

(3) Adhesion Evaluation Test
The same as in Example 1.

(4) Test for Evaluating the Resistance to Waste by Melting in a Molten Metal
A test was carried out in which in a melt of an aluminum alloy AC4C at 750° C., each test piece was moved up and down 90 times per minute for 3 hours with an amplitude of 30 mm. The resistance to waste by melting was evaluated in terms of the ratio between the mass values of the test piece before and after the test.

Table 6 shows the details of the coating layers of each of present inventive test pieces and comparative test pieces (the same as in Table 1 except that all of these test pieces were those subjected to the nitriding treatment) and the results of the evaluations. Since conventional test pieces did not have the coating layer structure used in the present invention, the definition of their outermost layer, layer just above the base material and intermediate layer is difficult. Therefore, these test pieces are shown in Table 7 (the details of their coating layers are the same as in Table 2 except that all of these test pieces were those subjected to the nitriding treatment).

TABLE 6

| | No. | Details of coating layers | Nitriding | Adhesion | Resistance to waste by melting (waste rate) (%) |
|---|---|---|---|---|---|
| Present inventive test piece | 31 | The same as those of present inventive test piece No. 1 | Conducted | A | 0.30 |
| | 32 | The same as those of present inventive test piece No. 2 | Conducted | A | 0.32 |
| | 33 | The same as those of present inventive test piece No. 3 | Conducted | A | 0.30 |
| | 34 | The same as those of present inventive test piece No. 4 | Conducted | B | 0.28 |
| | 35 | The same as those of present inventive test piece No. 5 | Conducted | A | 0.31 |
| | 36 | The same as those of present inventive test piece No. 6 | Conducted | A | 0.33 |
| | 37 | The same as those of present inventive test piece No. 7 | Conducted | A | 0.31 |

TABLE 6-continued

| | No. | Details of coating layers | Nitriding | Adhesion | Resistance to waste by melting (waste rate) (%) |
|---|---|---|---|---|---|
| | 38 | The same as those of present inventive test piece No. 8 | Conducted | A | 0.29 |
| | 39 | The same as those of present inventive test piece No. 9 | Conducted | A | 0.30 |
| Comparative test piece | 41 | The same as those of comparative test piece No. 11 | Conducted | F | 3.42 |
| | 42 | The same as those of comparative test piece No. 12 | Conducted | F | 3.55 |
| | 43 | The same as those of comparative test piece No. 13 | Conducted | C | 0.58 |
| | 44 | The same as those of comparative test piece No. 14 | Conducted | C | 0.52 |
| | 45 | The same as those of comparative test piece No. 15 | Conducted | E | 2.81 |

TABLE 7

| | No. | Details of coating layers | Nitriding | Adhesion | Resistance to waste by melting (waste rate) (%) |
|---|---|---|---|---|---|
| Conventional test piece | 51 | The same as those of conventional test piece No. 21 | Conducted | C | 0.65 |
| | 52 | The same as those of conventional test piece No. 22 | Conducted | A | 0.32 |
| | 53 | The same as those of conventional test piece No. 23 | Conducted | F | 3.36 |

It can be seen that as shown in Table 6, all of present inventive test pieces Nos. 31 to 39 are very excellent in the adhesion of the layers in spite of the large thickness of the layers because their coating layer structure was within the range specified in the present invention. It can also be seen that all of them are excellent also in resistance to waste by melting because of the satisfactory adhesion.

On the other hand, as to the evaluation results for the comparative test pieces and the conventional test pieces, comparative test pieces Nos. 41, 42 and 45, which are poor in the adhesion of the layers, are poor in resistance to waste by melting. Even comparative test pieces Nos. 43 and 44 are inferior to the present inventive test pieces in the adhesion of the layers. Conventional test pieces Nos. 51 and 53 are very poor in the adhesion of the layer. Conventional test piece No. 52 whose coating layer has a very low hardness is excellent in the adhesion of the layer but is likely to be early worn away.

Example 5

Next, core pins for die casting having a surface coating layer structure equal to those of present inventive test piece No. 34 and No. 35 in Table 6 and conventional test piece No. 52 in Table 7, respectively, were produced and then evaluated with respect to their life in an actual mold.

First, a toughness-improved material composed of high-speed steel as base and having the chemical composition shown in Table 4, which was the same material as that used in Example 4 as a base material for mold, was roughly processed in an annealed state into a shape similar to that of a core pin, and subjected to oil quenching from 1,080° C. and then thermal refining to 55 HRC by tempering at 600° C. Thereafter, finish processing was conducted and coating treatment was carried out under the same conditions as in Example 4 for obtaining each of the core pins described above. No surface hardening treatment was carried out before the coating treatment. In each of the core pins thus obtained, both of its hardness values at depths of 25 μm and 500 μm from the outermost surface of its base material were maintained at the above-mentioned thermal refining hardness 55 HRC (=595 HV 0.2) before and after the coating treatment.

Figure 6:
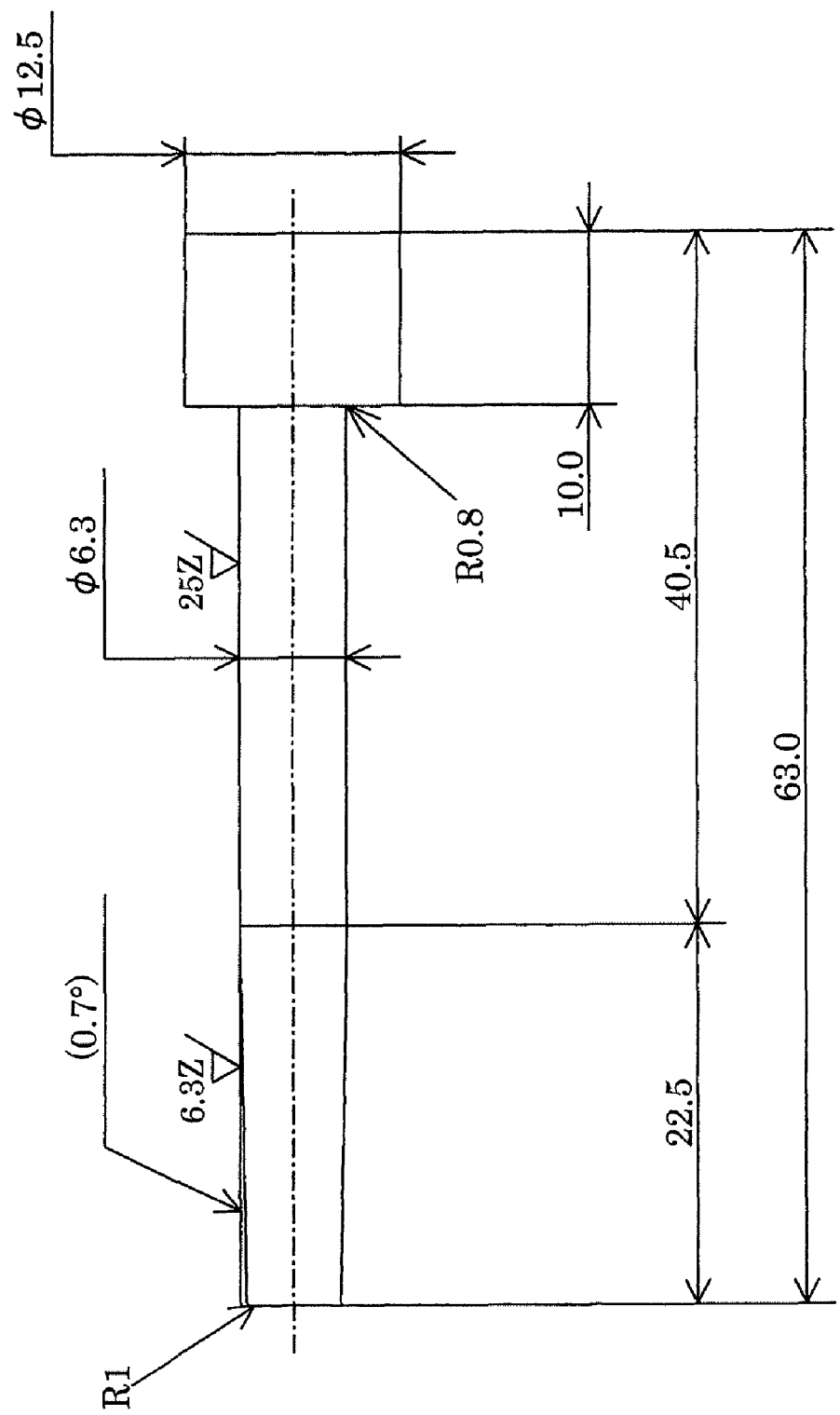
FIG. 6 is a diagram showing the shape of the core pin used in Example 5.

The core pins produced above had the shape shown in FIG. 6. Casting was conducted with a die casting machine of 300 t by using an aluminum alloy AC4C at a melt temperature of 700° C. Table 8 shows the life of the various core pins.

TABLE 8

| | No. | Tool life (number of castings) | Cause for expiration of life |
|---|---|---|---|
| Present inventive core pin | No. 34 | 143,000 | Seizure |
| | No. 35 | 131,000 | |
| Conventional core pin | No. 52 | 61,000 | Breaking |

The core pins obtained according to the present invention improved the life of a mold by a factor of two or more as compared with the conventional core pin. Finally, the life of the core pins obtained according to the present invention expired owing to the occurrence of seizure. On the other hand, the conventional core pin was worn away at its pointed end and then its life expired finally owing to breaking. It was confirmed that as described above, the application of the present invention to a core pin for die casting greatly improves the life of the pin.

INDUSTRIAL APPLICABILITY

The hard-material-coated member of the present invention is preferably used as a mold for plastic working which is used for plastic working of metals, such as cold or warm-hot forging or pressing and is required to have wear resistance. However, considering the adhesion of coating layers of the member and its wear resistance, the member can be used for plastic working of not only iron type metals but also titanium, aluminum and alloys thereof, depending on use conditions.

Furthermore, the hard-material-coated member of the present invention is preferably used also as a casting member used in contact with a molten metal, such as a mold used for die casting or casting, a core pin, a piston ring used in an injection machine for die casting, or the like. The molten metal (a casting material), however, is not limited to aluminum and aluminum alloys and the member can be used for casting a magnesium alloy.

The invention claimed is:

1. A hard-material-coated member with an excellent durability comprising a metal as base material and having coating layers formed at least on its working plane by physical vapor deposition, wherein at least three layers, i.e., a layer a as the outermost layer, a layer c just above the base material and a layer b between the layer a and the layer c are formed as the coating layers, where each of the three layers a, b and c contains a compound composed mainly of a metal common to the three layers; the hardness values of these layers in terms of hardness symbol HV 0.025 are as follows:

2500>(the hardness of the layer a)>1000,
3500>(the hardness of the layer b)>2300,
2500>(the hardness of the layer c)>1000,
(500+the hardness of the layer a)<(the hardness of the layer b), and
(500+the hardness of the layer c)<(the hardness of the layer b); the thickness of the layer b is smaller than that of the layer c; and the total thickness of the coating layers is 5 to 15 µm.

2. A hard-material-coated member with an excellent durability according to claim 1, wherein each of the layer a and the layer c consists of any of a nitride, a carbide or a carbonitride, the metal element portion of which is composed mainly of Ti or Cr, and the layer b consists of any of a nitride, a carbide or a carbonitride, the metal element portion of which is composed mainly of one or more elements selected from Ti or Cr.

3. A hard-material-coated member with an excellent durability according to claim 1, wherein the thickness of the layer a is 1 to 5 µm, the thickness of the layer b is 1 to 5 µM, and the thickness of the layer c is 2 to 7 µm.

4. A hard-material-coated member with an excellent durability according to claim 1, wherein the base material having the coating layers formed thereon has a hardness at a depth of 25 µm from the outermost surface of the base material which is higher than that at a depth of 500 µm from said outermost surface by 100 or more in terms of hardness symbol HV 0.2.

5. A hard-material-coated member with an excellent durability according to claim 1, which is a mold for plastic working.

6. A hard-material-coated member with an excellent durability according to claim 1, which is a member for casting.

7. A hard-material-coated member with an excellent durability according to claim 2, which is a mold for plastic working.

8. A hard-material-coated member with an excellent durability according to claim 3, which is a mold for plastic working.

9. A hard-material-coated member with an excellent durability according to claim 4, which is a mold for plastic working.

10. A hard-material-coated member with an excellent durability according to claim 2, which is a member for casting.

11. A hard-material-coated member with an excellent durability according to claim 3, which is a member for casting.

12. A hard-material-coated member with an excellent durability according to claim 4, which is a member for casting.

* * * * *